United States Patent
Pan et al.

(10) Patent No.: US 7,592,694 B2
(45) Date of Patent: Sep. 22, 2009

(54) CHIP PACKAGE AND METHOD OF MANUFACTURING THE SAME

(75) Inventors: Yu-Tang Pan, Tainan County (TW);
Men-Shew Liu, Tainan County (TW);
Shih-Wen Chou, Tainan County (TW)

(73) Assignee: ChipMOS Technologies Inc., Hsinchu (TW)

( * ) Notice: Subject to any disclaimer, the term of this patent is extended or adjusted under 35 U.S.C. 154(b) by 135 days.

(21) Appl. No.: 11/746,064

(22) Filed: May 9, 2007

(65) Prior Publication Data

US 2008/0142947 A1 Jun. 19, 2008

(30) Foreign Application Priority Data

Dec. 18, 2006 (TW) .............................. 95147426 A

(51) Int. Cl.
*H01L 23/495* (2006.01)
(52) U.S. Cl. ................. 257/692; 257/666; 257/690; 257/E23.01; 438/112; 438/126
(58) Field of Classification Search ................. 257/678, 257/690, 692, 701, 676; 438/112, 126, 127
See application file for complete search history.

(56) References Cited

U.S. PATENT DOCUMENTS

| | | | | | |
|---|---|---|---|---|---|
| 5,293,066 | A | * | 3/1994 | Tsumura | 257/668 |
| 5,394,298 | A | * | 2/1995 | Sagisaka | 361/704 |
| 6,522,015 | B1 | * | 2/2003 | Glenn et al. | 257/777 |
| 2003/0057534 | A1 | * | 3/2003 | Ho et al. | 257/678 |

FOREIGN PATENT DOCUMENTS

| | | |
|---|---|---|
| WO | 9317455 | 9/1993 |
| WO | 9508188 | 3/1995 |

* cited by examiner

*Primary Examiner*—Roy K Potter
(74) *Attorney, Agent, or Firm*—Jianq Chyun IP Office

(57) ABSTRACT

A chip package including a metal layer, a film-like circuit layer, a chip, a lead matrix and an encapsulant is provided. The film-like circuit layer disposed on the metal layer includes an insulating film disposed on the metal layer and a circuit layer disposed on the insulating film. The circuit layer has a plurality of conductive traces. The chip disposed above the metal layer is electrically connected to the conductive traces. The lead matrix having a plurality of leads is disposed outside the chip. At least part of the leads are electrically connected to the conductive traces. The encapsulant at least encapsulates the chip, the film-like circuit layer, at least part of the leads, and at least part of the metal layer.

19 Claims, 9 Drawing Sheets

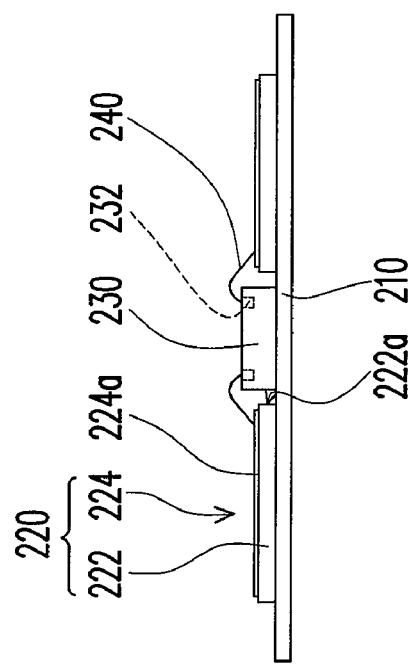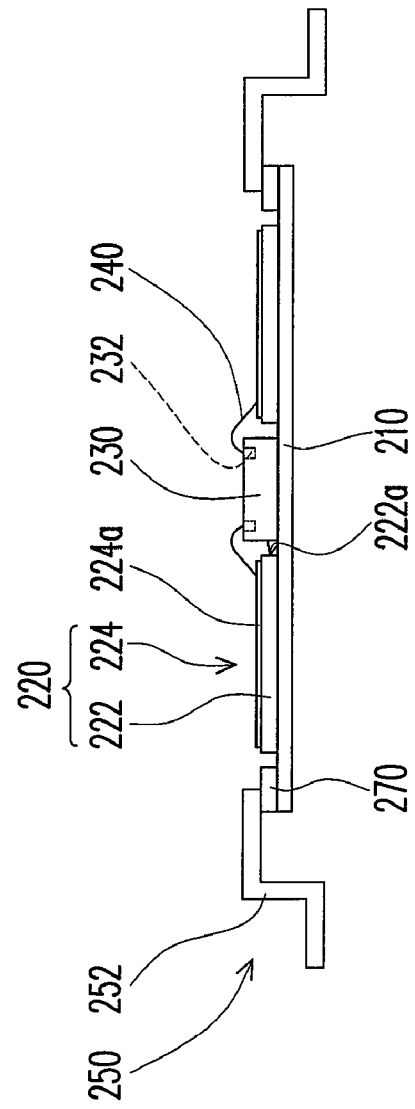

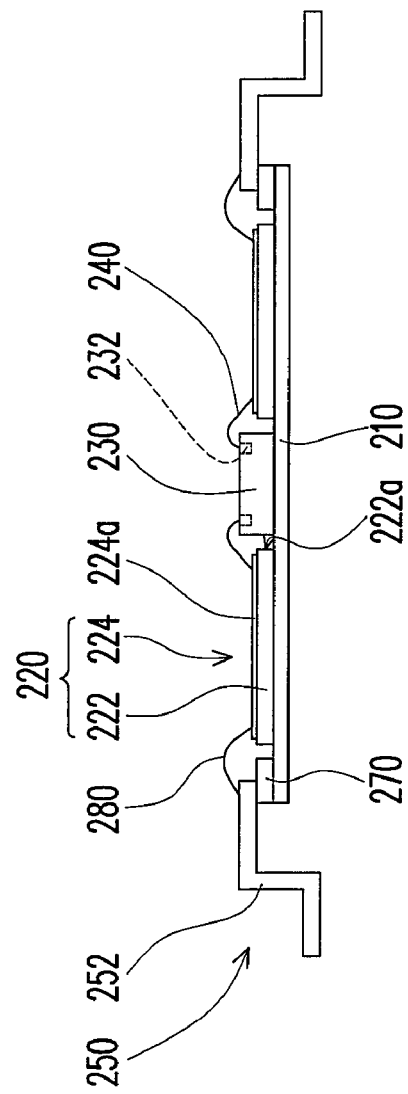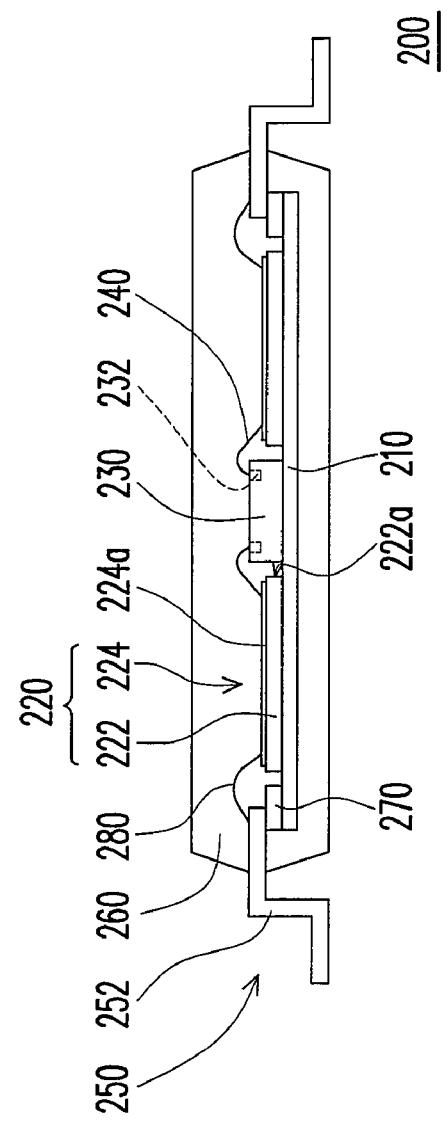

CHIP PACKAGE AND METHOD OF MANUFACTURING THE SAME

CROSS-REFERENCE TO RELATED APPLICATION

This application claims the priority benefit of Taiwan application serial no. 95147426, filed Dec. 18, 2006. All disclosure of the Taiwan application is incorporated herein by reference.

BACKGROUND OF THE INVENTION

1. Field of the Invention

The present invention generally relates to a semiconductor device and fabrication method thereof, and more particularly, to a chip package and method of manufacturing the same.

2. Description of Related Art

In the semiconductor industry, the fabrication of integrated circuits (IC) may be separated into three major stages: IC design stage, IC process stage and IC package stage.

In the IC process, the steps of producing a chip include at least wafer fabrication, IC formation and wafer sawing. The wafer has an active surface, in which active elements are formed. After the fabrication of IC in the wafer is completed, a plurality of bonding pads is disposed on the active surface of the wafer so that the chip subsequently cut out from the wafer may be electrically connected to a carrier through the bonding pads. The carrier is a lead frame or a package substrate, for example. The chip may be connected to the carrier by wire bonding technology or flip-chip bonding technology so that the bonding pads on the chip may be electrically connected to the contacts on the carrier to form a chip package.

FIG. 1 is a schematic cross-sectional view of a conventional chip package. As shown in FIG. 1, the conventional chip package 100 includes a lead frame 110, a chip 120, a plurality of bonding wires 130 and an encapsulant 140. The chip 120 is disposed on a chip pad 112 of the lead frame 110. Furthermore, a plurality of bonding pads 124 located on an active surface of the chip 120 is electrically connected to a plurality of inner leads 114 of the lead frame 110 through the bonding wires 130. The encapsulant 140 encapsulates the chip 120, the chip pad 112 and the inner leads 114 but exposes part of each outer lead 116 of the lead frame 110.

However, the size of the chip 120 and the number of bonding pads 124 on the chip 120 are two variables that may change according to the design requirements. Therefore, in order to dispose the chip 120 on the chip pad 112 and electrically connect to the inner leads 114, different kinds of chips 120 must use different lead frames 110. As a result, the specification of the lead frame 110 must change according to the size of the chip 120, and thereby the overall fabrication cost is increased. Furthermore, in order to reduce the length of each bonding wire 130 when the chip 120 is small, adjacent inner leads 114 have to extend in the direction of the chip 120, and thereby the length of each inner lead 114 is increased. Yet, with the reduction of pitch between adjacent inner leads 114, the inner leads 114 might vibrate in the process of forming the encapsulant 140. Consequently, the adjacent bonding wires 130 are increasingly liable to form undesirable short circuit.

SUMMARY OF THE INVENTION

The present invention is directed to a chip package having a plurality of leads capable of matching different kinds of chips or chips of different sizes.

The present invention is directed to a method of manufacturing a chip package having a plurality of leads capable of matching different kinds of chips or chips of different sizes.

The present invention provides a chip package. The chip package includes a metal layer, a film-like circuit layer, a chip, a lead matrix and an encapsulant. The film-like circuit layer disposed on the metal layer includes an insulating film and a circuit layer. The insulating film is disposed on the metal layer and a circuit layer disposed on the insulating film. The circuit layer has a plurality of conductive traces. The chip is disposed above the metal layer and electrically connected to the conductive traces. The lead matrix has a plurality of leads and is disposed outside the chip. At least part of the leads are electrically connected to the conductive traces. The encapsulant at least encapsulates the chip, the film-like circuit layer, at least part of the leads, and at least part of the metal layer.

In an embodiment of the present invention, the leads may be arranged to form a ring-like configuration.

In an embodiment of the present invention, the chip package further includes a plurality of first bonding wires electrically connecting the chip and the conductive traces.

In an embodiment of the present invention, the chip package further includes a plurality of bumps electrically connecting the chip and the conductive traces.

In an embodiment of the present invention, the chip package further includes insulating glue and at least one second bonding wire. The insulating glue is disposed between the leads and the metal layer. The second bonding wire electrically connects one of the conductive traces and one of the leads.

In an embodiment of the present invention, the chip package further includes a conductive layer disposed between one end of each lead and the film-like circuit layer. At least part of the leads are electrically connected to the conductive traces through the conductive layer.

In an embodiment of the present invention, the insulating film may have an opening exposing the metal layer. The chip is disposed on the metal layer inside the opening.

In an embodiment of the present invention, the chip may be disposed on the insulating film.

In an embodiment of the present invention, the circuit layer may further have a heat-dissipating material, for example, heat-dissipating metal or heat-dissipating glue and the chip is disposed on the heat-dissipating material. In addition, the film-like circuit layer further includes at least one thermal conductive via that passes through the insulating film and connects the heat-dissipating material and the metal layer.

In an embodiment of the present invention, the conductive traces may radiate from the neighborhood of the chip.

In an embodiment of the present invention, the encapsulant may completely encapsulate the metal layer.

In an embodiment of the present invention, the metal layer includes a metal film or a metal plate.

The present invention also provides a method of manufacturing a chip package including the following steps. First, a metal layer and a film-like circuit layer are provided. The film-like circuit layer is disposed on the metal layer. The film-like circuit layer includes an insulating film disposed on the metal layer and a circuit layer disposed on the insulating film. The circuit layer has a plurality of conductive traces. Next, a chip is disposed above the metal layer and then the chip is electrically connected to the conductive traces. After that, a lead matrix having a plurality of leads is disposed outside the chip. Subsequently, at least part of the leads are electrically connected to the conductive traces. Finally, an encapsulant is formed to encapsulate at least the chip, the film-like circuit layer, at least part of the leads and at least part of the metal layer.

In an embodiment of the present invention, the step of electrically connecting the chip and the conductive traces includes forming a plurality of first bonding wires to connect the chip and the conductive traces.

In an embodiment of the present invention, the step of electrically connecting the chip and the conductive traces includes connecting the chip and the conductive traces through a plurality of bumps.

In an embodiment of the present invention, the step of disposing a lead matrix outside the chip may be attaching the leads to the metal layer through insulating glue. In addition, the step of electrically connecting at least part of the leads and the conductive traces includes forming a plurality of second bonding wires for electrically connecting at least part of the leads and the conductive traces.

In an embodiment of the present invention, the step of electrically connecting at least part of the leads and the conductive traces includes attaching at least part of the leads to the conductive traces through a conductive layer.

In an embodiment of the present invention, the insulating film may have an opening exposing the metal layer. The step of disposing the chip above the metal layer may be disposing the chip on the metal layer inside the opening.

In an embodiment of the present invention, the step of disposing the chip above the metal layer may be disposing the chip on the insulating film.

In an embodiment of the present invention, the circuit layer may have a heat-dissipating material. The step of disposing the chip above the metal layer may be disposing the chip on the heat-dissipating material. In addition, the film-like circuit layer further includes at least one thermal conductive via that passes through the insulating film and connects the heat-dissipating material and the metal layer.

In an embodiment of the present invention, the step of providing the metal layer and the film-like circuit layer includes attaching the film-like circuit layer to the metal layer. The metal layer may be a metal plate.

In an embodiment of the present invention, the step of providing the metal layer and the film-like circuit layer includes forming a metal layer on the film-like circuit layer. The metal layer may be a metal film. In addition, the method of forming the metal layer includes performing a sputtering process.

Accordingly, because the film-like circuit layer of the present invention may have different layout designs, the same lead matrix may match chips having different number of bonding pads or chips having different sizes. In addition, the pitch between the adjacent inner leads of the conventional lead frame is limited to maintain a definite mechanical strength. Yet, the pitch between adjacent conductive traces in the film-like circuit layer of the present invention may be smaller than that of the inner leads of the conventional lead frame. As a result, a structural design having a finer pitch may be achieved. Furthermore, the number of leads in the present invention may be increased according to the actual requirements.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A to 3F are schematic cross-sectional views showing a method of manufacturing the chip package according to the first embodiment of the present invention.

DESCRIPTION OF THE EMBODIMENTS

First Embodiment

Figure 2A:
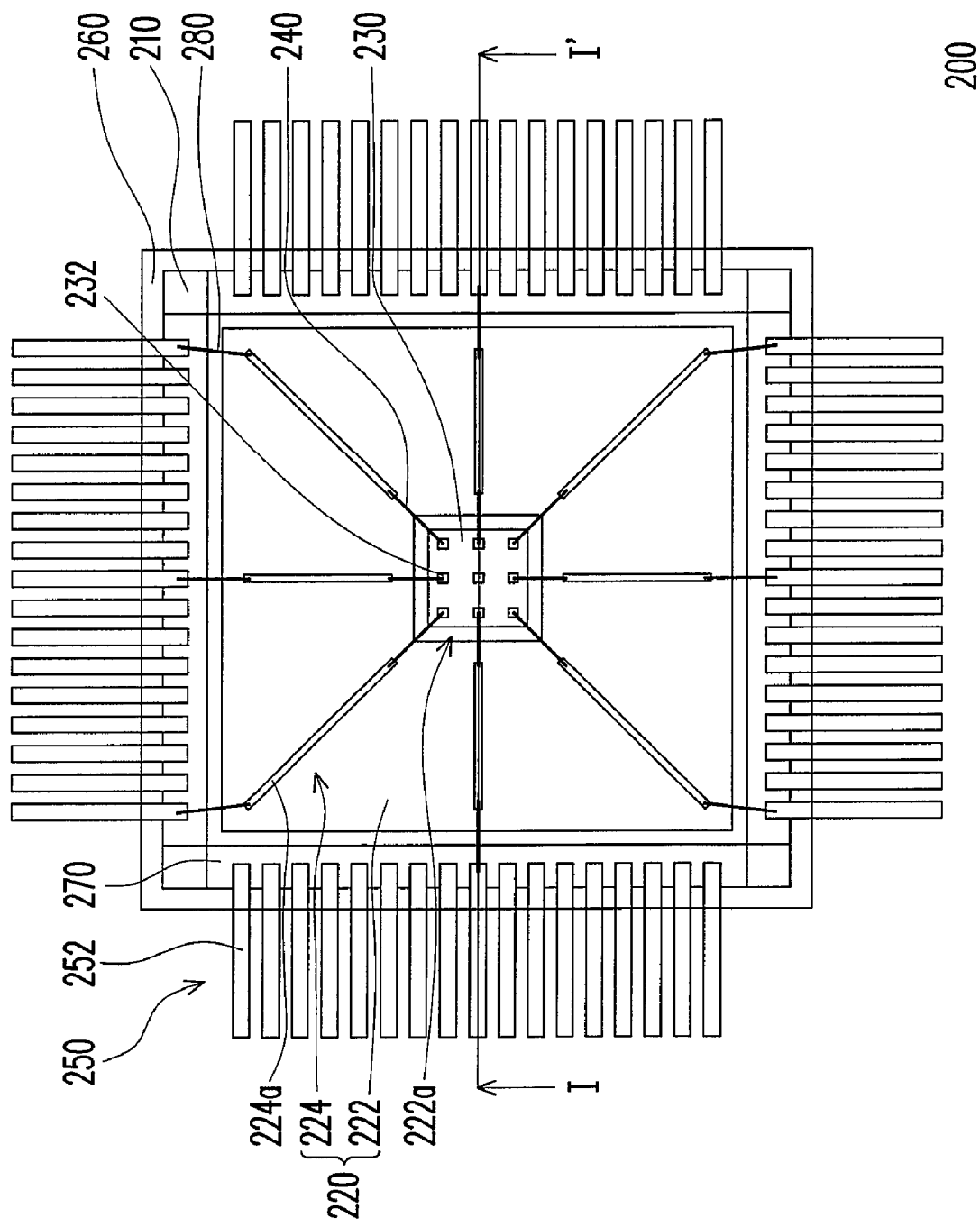
FIG. 2A is a schematic top view of a chip package according to a first embodiment of the present invention.
Figure 2B:
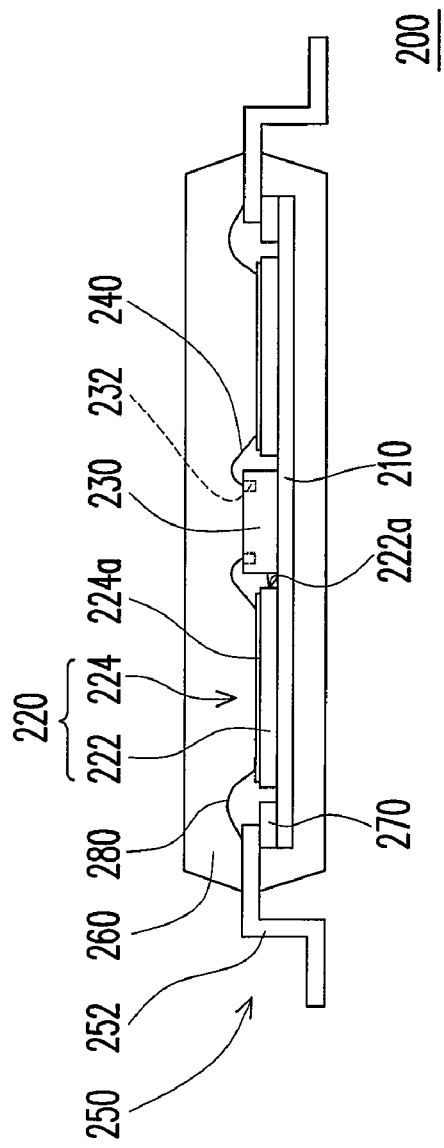
FIG. 2B is a schematic cross-sectional view of the chip package along line I-I' in FIG. 2A.

FIG. 2A is a schematic top view of a chip package according to a first embodiment of the present invention. FIG. 2B is a schematic cross-sectional view of the chip package along line I-I' in FIG. 2A. As shown in FIGS. 2A and 2B, the chip package 200 in the first embodiment includes a metal layer 210, a film-like circuit layer 220, a chip 230, a plurality of first bonding wires 240, a lead matrix 250 and an encapsulant 260. The thin-film circuit layer 220 is disposed on the metal layer 210 and includes an insulating film 222 and a circuit layer 224. The insulating film 222 is disposed on the metal layer 210 and the circuit layer 224 is disposed on the insulating film 222. The circuit layer 224 has a plurality of conductive traces 224a.

The chip 230 is disposed above the metal layer 210. The first bonding wires 240 electrically connect a plurality of bonding pads 232 on the chip 230 and the conductive traces 224a. The lead matrix 250 is disposed outside the chip 230 and has a plurality of leads 252. At least part of the leads 252 are electrically connected to the conductive traces 224a. It should be noted that the leads 252 of the lead matrix 250 may be arranged outside at least two sides of the chip 230. For example, the leads 252 may be arranged outside two sides of the chip 230 or may be arranged outside four sides of the chip 230 so as to produce a ring-like configuration. The encapsulant 260 at least encapsulates the chip 230, the first bonding wires 240, the film-like circuit layer 220, at least part of the leads 252 and at least part of the metal layer 210. In the present embodiment, the encapsulant 260 completely encapsulates the metal layer 210. However, the encapsulant 260 may expose part of a surface of the metal layer 210 (with details described below).

Figure 1:
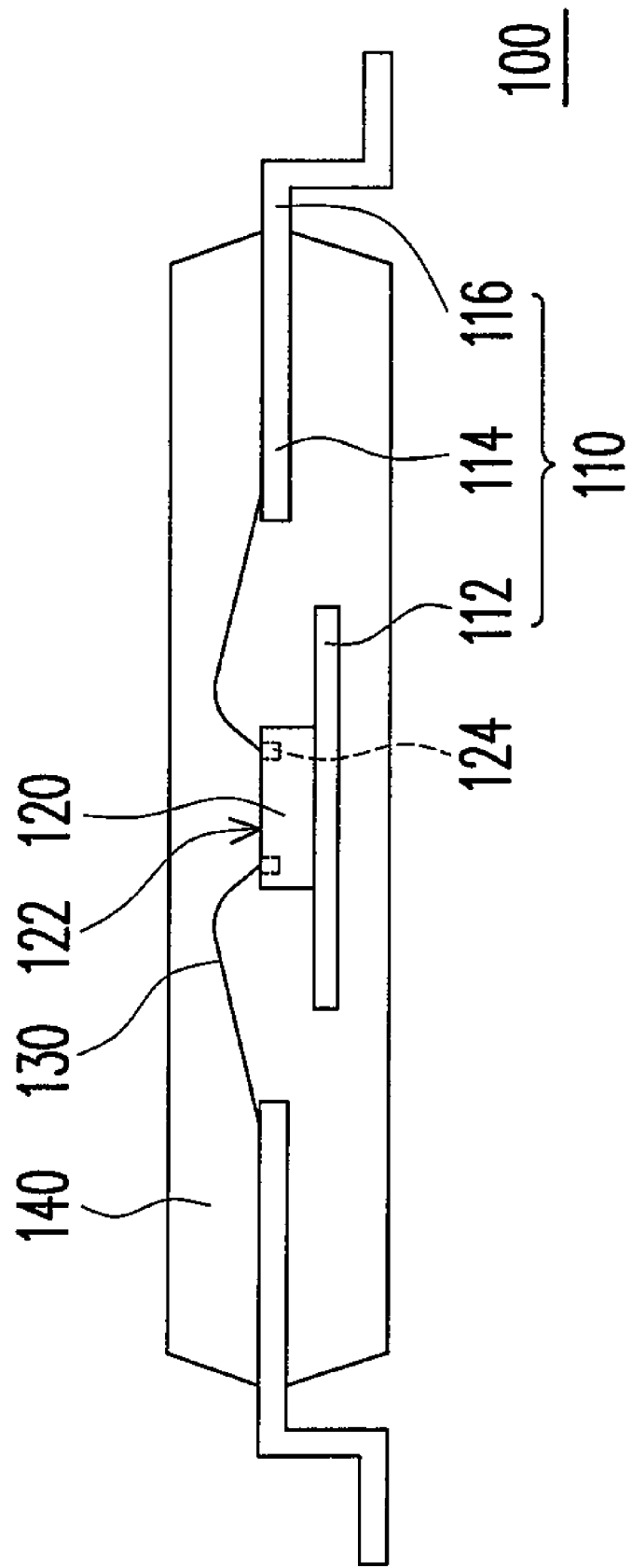
FIG. 1 is a schematic cross-sectional view of a conventional chip package.

Because the film-like circuit layer may have different layout designs, the same lead matrix 250 may match chips 230 having different number of bonding pads 232 or chips 230 having different sizes. Since the film-like circuit layer 220 may serve as a medium through which the chip 230 is electrically connected to the leads 252, the length of each first bonding wire 240 of the chip package 200 of the present embodiment is shorter than that of each bonding wire 130 in the conventional chip package 100 (see FIG. 1). As a result, in the process of forming the encapsulant 260 of the chip package 200 in the present embodiment, the first bonding wires 240 are not easily broken or made to contact each other to form a short circuit during infusion of the encapsulant 260. In addition, the pitch between the adjacent inner leads 114 of the conventional lead frame 110 is limited. Yet, the pitch between adjacent conductive traces 224a in the film-like circuit layer 220 of the present embodiment may be smaller. As a result, a structural design having a finer pitch may be achieved. Furthermore, the number of leads 252 may be increased according to the actual requirements.

In the first embodiment, the chip package 200 further includes insulating glue 270 and a plurality of second bonding wires 280. The insulating glue 270 is disposed between the leads 252 and the metal layer 210, and the second bonding wires 280 electrically connect one of the conductive traces 224a and one of the leads 252. In addition, the conductive traces 224a may radiate from the neighborhood of the chip 230, as shown in FIG. 2A. Moreover, the leads 252 and the conductive traces 224a do not have to be electrically connected through the second bonding wires 280. The leads 252 may be electrically connected to the conductive trace 224a through a conductive material (details are described below).

In addition, the insulating film 222 may have an opening 222a exposing part of the metal layer 210. The chip 230 is disposed on the metal layer 210 inside the opening 222a. Therefore, heat produced by the chip 230 may be transferred to the metal layer 210. However, the chip 230 may be disposed on the insulating film 222 or the circuit layer 224 (details are described below). Moreover, in the present embodiment, the metal layer 210 may be a metal plate. However, in other embodiment, the metal layer 210 may also be a metal film (details are described below).

Figure 2C:
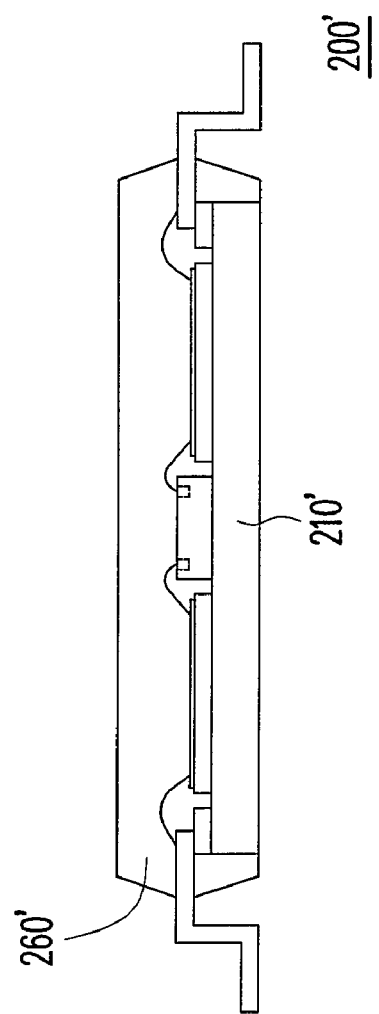
FIG. 2C is a schematic cross-sectional view of another chip package according to the first embodiment of the present invention.

FIG. 2C is a schematic cross-sectional view of another chip package according to the first embodiment of the present invention. As shown in FIGS. 2B and 2C, the main difference between the chip package 200' and the chip package 200 is that the encapsulant 260 of the chip package 200 completely encapsulates the metal layer 210 while the encapsulant 260' of the chip package 200' only partially encapsulates the metal layer 210'. Consequently, the bottom portion of the metal layer 210' is exposed outside the encapsulant 260' and the heat-dissipating capacity of the chip package 200' is improved. It should be noted that a configuration in which the encapsulant 260 completely encapsulates the metal layer 210 (as shown in FIG. 2B) is used in the following embodiments to facilitate description.

Figure 3A:
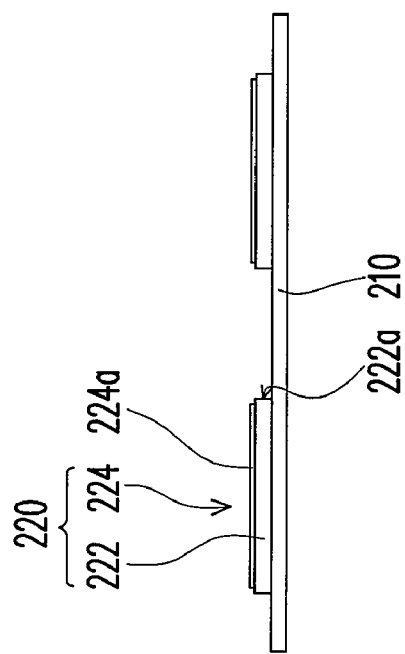

In the following, a method of manufacturing the chip package 200 is described. FIGS. 3A to 3F are schematic cross-sectional views showing a method of manufacturing the chip package according to the first embodiment of the present invention. The method of manufacturing the chip package of the first embodiment includes the following steps. First, as shown in FIG. 3A, a metal layer 210 and a film-like circuit layer 220 are provided. The metal layer 210 may be a metal plate. Next, the film-like circuit layer 220 is attached to the metal layer 210. The film-like circuit layer 220 includes an insulating film 222 and a circuit layer 224. The insulating film 222 is disposed on the metal layer 210 and the circuit layer 224 is disposed on the insulating film 222. In addition, the circuit layer 224 has a plurality of conductive traces 224a.

Figure 3B:
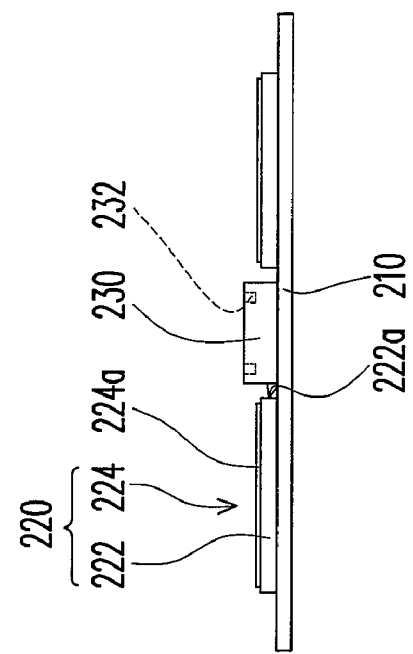

Next, as shown in FIG. 3B, a chip 230 is disposed above the metal layer 210. More specifically, the insulating film 222 may have an opening 222a exposing part of the metal layer 210. The chip 230 is disposed on the metal layer 210 inside the opening 222a.

Next, as shown in FIG. 3C, a plurality of first bonding wires 240 is formed for electrically connecting the chip 230 and the conductive traces 224a. In addition, not all the conductive traces 224a in the present embodiment are required to be electrically connected to the chip 230. In other words, when the number of bonding pads 232 of the chip 230 is smaller than the number of conductive traces, only part of the conductive traces 224a are electrically connected to the chip 230.

After that, as shown in FIG. 3D, a lead matrix 250 is disposed outside the chip 230. The lead matrix 250 has a plurality of leads 252 arranged to form a ring-like configuration. In the present embodiment, the leads 252 may be attached to the metal layer 210 through insulating glue 270.

After that, as shown in FIG. 3E, at least part of the leads 252 are electrically connected to the conductive traces 224a. In the first embodiment, the electrical connections between the leads 252 and the conductive traces 224a may be achieved through a plurality of second bonding wires 280. The second bonding wires 280 connect at least part of the leads 252 and the conductive traces 224a. In other words, not all the leads 252 are required to be electrically connected to the conductive traces 224a in the present embodiment. That means, the number of conductive traces 224a electrically connected to the chip 230 may be smaller than or equal to the number of the leads 252.

Subsequently, as shown in FIG. 3F, an encapsulant 260 is formed to encapsulate at least the chip 230, the first bonding wires 240, the film-like circuit layer 220, part of the leads 252 and the metal layer 210. In the first embodiment, the encapsulant 260 further encapsulates the second bonding wires 280. After the foregoing steps, a complete chip package 200 is basically formed.

It should be noted that the film-like circuit layer 220 serves as a medium through which the chip 230 is electrically connected to the leads 252. Therefore, compared to the bonding wires 130 of the conventional chip package 100 (see FIG. 1), the length of each first bonding wire 240 of the chip package 200 of the present embodiment is shorter and that of each second bonding wire 280 of the chip package 200 of the present embodiment is shorter. As a result, in the process of forming the encapsulant 260 of the chip package 200 in the present embodiment, the first bonding wires 240 and the second bonding wires 280 are not so easily broken or made to contact each other to form a short circuit during infusion of the encapsulant 260. In addition, since chips having different sizes and number of bonding pads may match the same lead matrix 250 just by modifying the layout design of the film-like circuit layer 220, overall fabrication cost is reduced.

Second Embodiment

Figure 4:
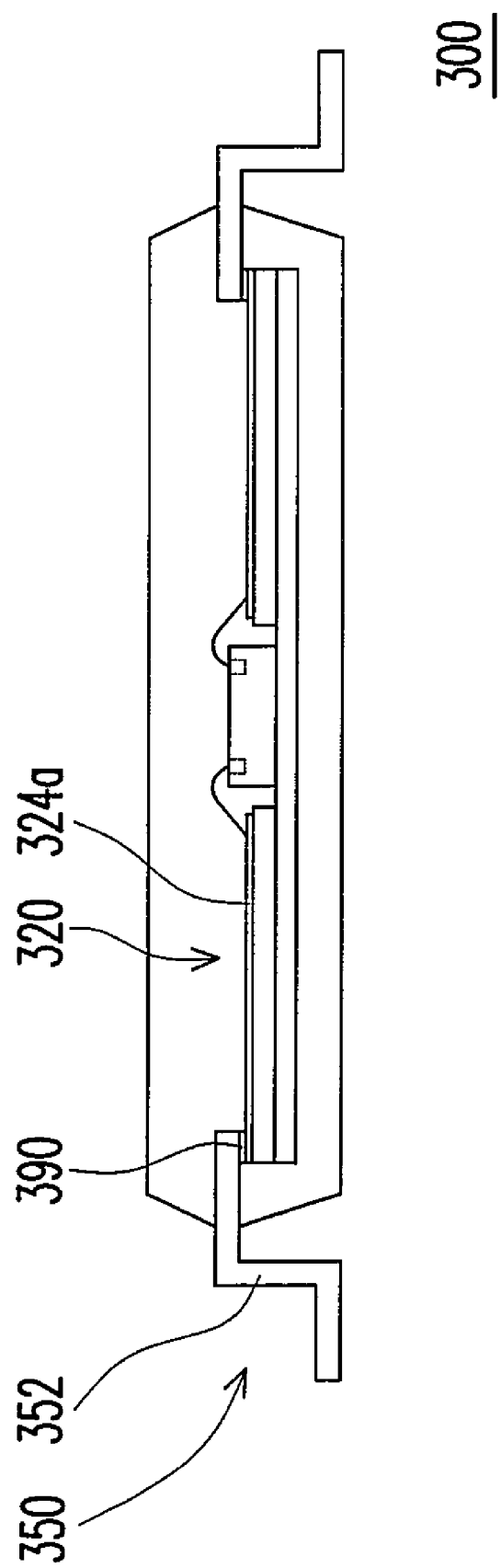
FIG. 4 is a schematic cross-sectional view of a chip package according to a second embodiment of the present invention.

FIG. 4 is a schematic cross-sectional view of a chip package according to a second embodiment of the present invention. The main difference between the chip package 300 of the second embodiment and the chip package 200 of the first embodiment is that the lead matrix 350 of the chip package 300 may be disposed on the film-like circuit layer 320. More specifically, in the second embodiment, the chip package 300 further includes a conductive layer 390, for example, solder material, anisotropic conductive paste (ACP), anisotropic conductive film (ACF) or conductive B-stage glue. The conductive layer 390 is disposed between one end of each lead 352 and the film-like circuit layer 320. At least part of the leads 352 are electrically connected to the conductive traces 324a through the conductive layer 390. In other words, in the second embodiment, at least part of the leads 325 are attached to the conductive traces 324a through the conductive layer 390. In addition, as in the first embodiment, not all the leads 352 are required to be electrically connected to the conductive traces 324a.

Third Embodiment

Figure 5:
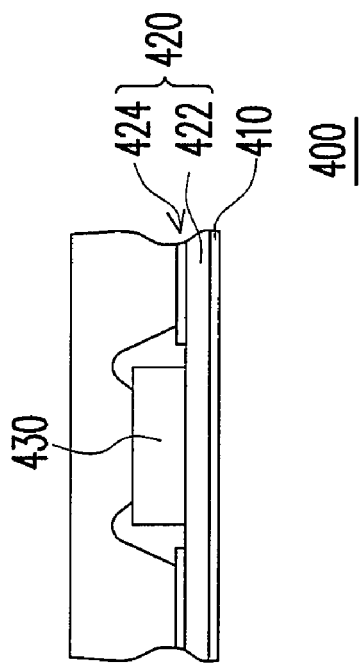
FIG. 5 is a schematic cross-sectional view of a chip package according to a third embodiment of the present invention.

FIG. 5 is a schematic cross-sectional view of a chip package according to a third embodiment of the present invention. The main difference between the chip package 400 of the third embodiment and the chip packages 200 and 300 of the above two embodiments is that the chip 430 of the chip package 400 may be disposed on the insulating film 422 of the film-like circuit layer 420. In addition to being the metal plate as described in the first embodiment, the metal layer 410 may be formed on the insulating film 422 by performing a sputtering process. Consequently, the circuit layer 424 and the metal layer 410 are located on the two opposite surfaces of the insulating film 422 respectively. The metal layer 410 formed by the sputtering process is a metal film that has a thickness smaller than the metal plate.

Fourth Embodiment

Figure 6:
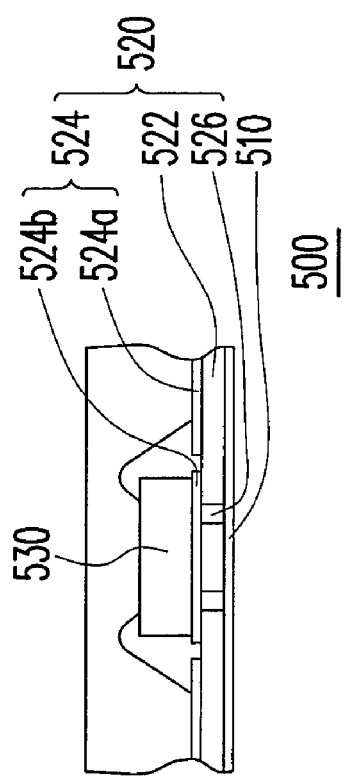
FIG. 6 is a schematic cross-sectional view of a chip package according to a fourth embodiment of the present invention.

FIG. 6 is a schematic cross-sectional view of a chip package according to a fourth embodiment of the present invention. The main difference between the chip package 500 of the fourth embodiment and the chip packages 200, 300 and 400 of the above three embodiments is that the circuit layer 524 of the chip package 500 may further have heat-dissipating material 524b in addition to having the conductive traces 524a. Furthermore, the chip 530 is disposed on the heat-dissipating material 524b. The heat-dissipating material 524b may be a heat-dissipating metal layer or heat-dissipating glue. In addition, the film-like circuit layer 520 further includes at least one thermal conductive via 526 that passes through the insulating film 522 and connects the heat-dissipating material 524b to the metal layer 510. Therefore, compared to the chip package 400 of the third embodiment, the chip package 500 of the fourth embodiment has higher heat-dissipating capacity.

Fifth Embodiment

Figure 7:
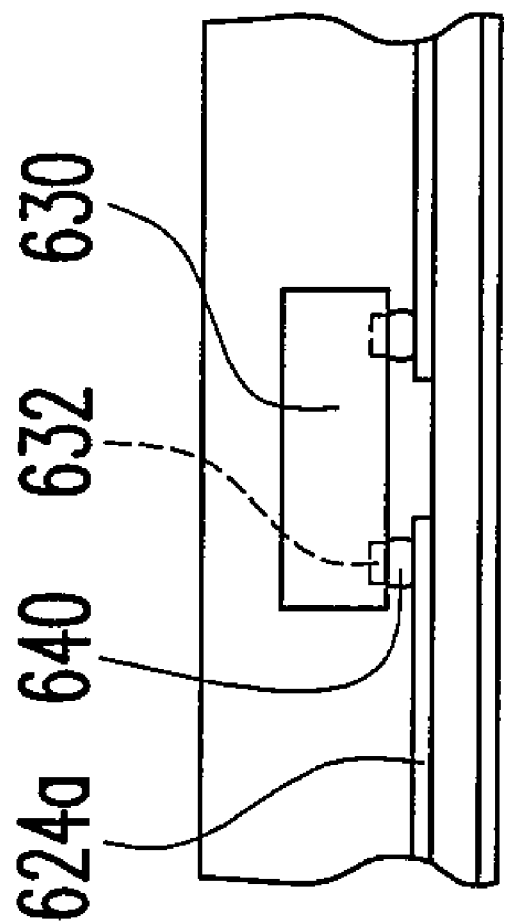
FIG. 7 is a schematic cross-sectional view of a chip package according to a fifth embodiment of the present invention.

FIG. 7 is a schematic cross-sectional view of a chip package according to a fifth embodiment of the present invention. The main difference between the chip package 600 of the fifth embodiment and the chip packages 200, 300, 400 and 500 of the above four embodiments is that the bonding pads 632 of the chip 630 are electrically connected to the conductive traces 624a through bumps 640.

It should be noted that the foregoing embodiments are illustrated using a single chip. However, based on the description of the foregoing chip package designs, a designer may design a multi-chip package or a stacked chip package. Accordingly, the foregoing embodiments serve only to illustrate the present invention and are not intended to limit the scope of the present invention.

In summary, the advantages of the chip package of the present invention and method of manufacturing the same include:

1. Because the film-like circuit layer of the present invention may have different layout designs, the same lead matrix may match chips having different number of bonding pads or chips having different sizes to reduce the packaging cost.

2. Because the film-like circuit layer of the present invention may serve as a medium through which the chip is electrically connected to the leads, the length of each bonding wire of the chip package of the present invention is shorter than that of each bonding wire of the conventional chip package. As a result, in the process of forming the encapsulant of the chip package of the present invention, the bonding wires are not so easily broken or made to contact each other to form a short circuit during infusion of the encapsulant.

3. The method of manufacturing the chip package of the present invention may be integrated with the existing processes and a smaller pitch between adjacent conductive traces may be used in the layout design. Furthermore, defects of tilting and short-circuiting of the leads after forming encapsulant due to over-extension of the leads in the conventional chip package may be avoided in the chip package of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
    a metal layer;
    a film-like circuit layer, disposed on the metal layer, comprising:
        an insulating film, disposed on the metal layer; and
        a circuit layer, disposed on the insulating film, wherein the circuit layer has a plurality of conductive traces;
    a chip, disposed above the metal layer, wherein the chip is electrically connected to the conductive traces;
    a lead matrix, disposed outside the chip, having a plurality of leads, wherein at least part of the leads are electrically connected to the conductive traces;
    an insulating glue, disposed between the leads and the metal layer in direct contact, wherein the leads are partly overlying the metal layer; and
    an encapsulant, at least encapsulating the chip, the film-like circuit layer, at least part of the leads and at least part of the metal layer.

2. The chip package according to claim 1, further comprising a plurality of first bonding wires electrically connecting the chip to the conductive traces.

3. The chip package according to claim 1, further comprising a plurality of bumps electrically connecting the chip and the conductive traces.

4. The chip package according to claim 1, further comprising:
    at least one second bonding wire electrically connecting one of the conductive traces and one of the leads.

5. The chip package according to claim 1, wherein the insulating film has an opening exposing the metal layer and the chip is disposed on the metal layer inside the opening.

6. The chip package according to claim 1, wherein the chip is disposed on the insulating film.

7. The chip package according to claim 1, wherein the circuit layer further comprises a heat-dissipating material and the chip is disposed on the heat-dissipating material.

8. The chip package according to claim 7, wherein the film-like circuit layer further comprises at least a thermal conductive via that passes through the insulating film and connects the heat-dissipating material and the metal layer.

9. The chip package according to claim 7, wherein the heat-dissipating material is heat-dissipating metal or heat-dissipating glue.

10. The chip package according to claim 1, wherein the conductive traces radiate from the neighborhood of the chip.

11. The chip package according to claim 1, wherein the encapsulant completely encapsulates the metal layer.

12. The chip package according to claim 1, wherein the metal layer comprises a metal film or a metal plate.

13. A method of manufacturing a chip package, comprising:
   providing a metal layer and a film-like circuit layer, wherein the film-like circuit layer is disposed on the metal layer and comprises an insulating film disposed on the metal layer and a circuit layer disposed on the insulating film, and the circuit layer has a plurality of conductive traces;
   disposing a chip above the metal layer;
   electrically connecting the chip and the conductive traces;
   disposing a lead matrix outside the chip, wherein the lead matrix has a plurality of leads and the leads are attached to the metal layer through an insulating glue in direct, wherein the leads are partly overlying the metal layer;
   electrically connecting at least part of the leads and the conductive traces; and
   forming an encapsulant to encapsulate at least the chip, the film-like circuit layer, at least part of the leads and at least part of the metal layer.

14. The method according to claim 13, wherein the step of electrically connecting the chip and the conductive traces comprises forming a plurality of first bonding wires so as to connect the chip and the conductive traces.

15. The method according to claim 13, wherein the step of electrically connecting the chip and the conductive traces comprises connecting the chip and the conductive traces through a plurality of bumps.

16. The method according to claim 13, wherein the step of electrically connecting at least part of the leads and the conductive traces comprises forming a plurality of second bonding wires so as to connect at least part of the leads and the conductive traces.

17. The method according to claim 13, wherein the insulating film has an opening exposing the metal layer and the step of disposing the chip above the metal layer is disposing the chip on the metal layer inside the opening.

18. The chip package according to claim 1, wherein the metal layer is a continuous base layer to hold the chip, the film-like circuit layer and the leads.

19. The method according to claim 13, wherein the metal layer is provided as a continuous base layer to hold the chip, the film-like circuit layer and the leads.

* * * * *